United States Patent [19]

Sakaguchi et al.

[11] Patent Number: 4,483,734

[45] Date of Patent: Nov. 20, 1984

[54] METHOD FOR THE PREPARATION OF SINGLE CRYSTALS OF GADOLINIUM GALLIUM GARNET

[75] Inventors: Susumu Sakaguchi, Kanagawa; Kazuyoshi Watanabe, Gunma; Masahiro Ogihara, Gunma; Toshihiko Ryuoh, Gunma; Masaaki Iguchi, Gunma; Norifumi Yoshida, Gunma, all of Japan

[73] Assignee: Shin-Etsu Chemical Co., Ltd., Tokyo, Japan

[21] Appl. No.: 485,903

[22] Filed: Apr. 18, 1983

Related U.S. Application Data

[63] Continuation-in-part of Ser. No. 344,872, Feb. 1, 1982, abandoned.

[30] Foreign Application Priority Data

Feb. 9, 1981 [JP] Japan .................................. 56-17826
Mar. 13, 1981 [JP] Japan .................................. 56-36135

[51] Int. Cl.$^3$ .............................................. C30B 15/04
[52] U.S. Cl. ............................. 156/605; 156/DIG. 63
[58] Field of Search ................. 156/605, 606, 617 SP, 156/DIG. 63

[56] References Cited

U.S. PATENT DOCUMENTS 3,437,432  4/1969  Borchardt .................. 156/DIG. 63
4,199,396  4/1980  Brandle et al. ............. 156/DIG. 63
4,302,280  11/1981  Bruni .......................... 156/DIG. 63

OTHER PUBLICATIONS

Brandle et al., Jl. of Crystal Growth, vol. 12, No. 1, 1972, pp. 3–8.
Bruni, Crystal, vol. 1, Springer Verlag, N.Y., 1978, pp. 54–56.

*Primary Examiner*—Hiram H. Bernstein
*Attorney, Agent, or Firm*—Toren, McGeady and Stanger

[57] ABSTRACT

In the crystal growing of GGG (gadolinium gallium garnet) by the Czochralski technique from a melt of the oxide mixture of gadolinium and gallium, zinc is added to the oxide melt as a dopant element in a limited amount so that the danger of crack formation in the grown single crystals can be greatly decreased contributing to the improvement of the productivity. Moreover, the GGG single crystal grown with zinc doping has remarkably reduced light absorption in the wavelength region of around 300 nm responsible to the yellowish tint of the crystals.

2 Claims, 2 Drawing Figures

METHOD FOR THE PREPARATION OF SINGLE CRYSTALS OF GADOLINIUM GALLIUM GARNET

BACKGROUND OF THE INVENTION

This application is a continuation-in-part application from a copending U.S. application Ser. No. 344,872 filed Feb. 1st, 1982 and now abandoned.

As is well known, single crystals of gadolinum gallium garnet (referred to as GGG hereinbelow), which is a composite oxide compound of the formula $Gd_3Ga_5O_{12}$, are useful as a material for the substrate of the so-called magnetic bubble domain memory in the computer technology and as a material of man-made gemstones in jewelry. Single crystals of GGG are usually prepared, though not limited thereto, by the so-called Czochralski method in which the single crystal is grown by pulling up from a melt of an approximately stoichiometric mixture of gadolinium oxide $Gd_2O_3$ and gallium oxide $Ga_2O_3$.

When a single crystal of GGG is to be used satisfactorily in the above mentioned applications, the single crystal must have high quality in any way. For example, the lattice constant of the single crystals used in the magnetic bubble domain memory should be uniform as far as possible and the single crystal should contain no crystal defects while one of the essential requirements for the single crystals for jewelry use is the transparency and colorlessness of the crystal as complete as possible.

To give a recent trend in the computer technology using GGG as the substrate for the magnetic bubble domain memory, there is a growing demand for the substrates with larger and larger diameter. For example, the mainstream of the diameter of GGG substrates is now about 75 mm rather than 50 mm and it may be a fair expectation that GGG substrates of as large as 100 mm or larger in diameter will be used in the near future. In compliance with the above mentioned trend of demand for larger and larger substrates of magnetic bubble domain memory, the boules of the GGG single crystals, from which the substrate plates are fabricated by slicing, must have larger diameters accordingly whereas the difficulties encountered in the crystal growing increases rapidly with the increase in the diameter of the single crystal boules. That is, it is rather a difficult problem to prevent formation of cracks in the single crystal boules as grown when the boule has a large diameter along with the problems to ensure uniformity of the crystal quality throughout the boule. This is because a single crystal boule having a larger diameter is necessarily accompanied by larger stress in the boule so that the possibility of crack formation increases so much not only in the single crystal boule as grown as well as in the single crystal boule under mechanical working to fabricate substrate plates but also in the substrate plate under processing for the preparation of magnetic bubble domain memory such as in the steps of epitaxial film deposition and pattern formation.

Apart from the problem of the crack formation in the GGG single crystal boules, several attempts have been made to improve the quality of the GGG single crystals in certain respects including coloring by adding small amounts of certain dopant elements such as magnesium, calcium, barium, strontium and the like to the melt of the mixed oxides of gadolinium oxide and gallium oxide in the crystal growing by the Czochralski method (see, for example, U.S. Pat. No. 4,199,396 and Japanese Patent Kokai Nos. 53-5100 and 55-60089).

The above mentioned method of the addition of dopant elements to the oxide melt is not free from drawbacks on the other side that the dopant elements are taken up in the single crystals as grown leading to increased crack formation and, in some cases, intensified coloration or tint of the single crystals.

SUMMARY OF THE INVENTION

It is therefore an object of the present invention to provide a novel method for the preparation of a GGG single crystal by growing from the oxide melt of gadolinium oxide and gallium oxide, according to which the crack formation in the single crystal boules can greatly be reduced and yet the single crystals obtained by the method have outstandingly high quality not only in respect of the crystallographic characteristics but also in respect of coloration.

The method of the present invention, which has been established on the unexpected discovery that addition of a specific dopant element to the oxide melt is surprisingly effective to achieve the above mentioned object, comprises admixing the oxide melt composed of gadolinium oxide and gallium oxide with at least 1 p.p.m. by weight or, preferably, from 5 to 100 p.p.m. by weight of zinc as a dopant element based on the weight of the oxide mixture and growing a single crystal of GGG from the thus doped oxide melt by use of a seed crystal of GGG.

It is a further advantageous condition in practicing the above method of the present invention that the impurity level in the oxide melt, in particular, relative to the contents of magnesium, calcium, barium and strontium does not exceed 10 p.p.m. by weight for each of the above named impurity elements.

DETAILED DESCRIPTION OF THE PREFERRED EMBODIMENTS

Figure 1:
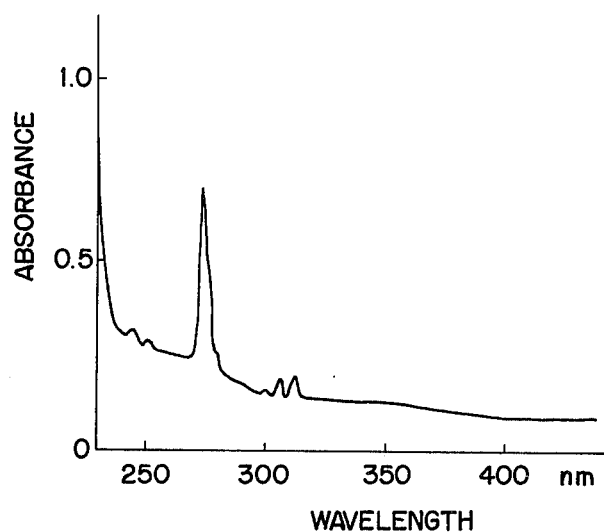
FIGS. 1 and 2 are each the photometric absorption spectrum of the single crystals of GGG doped with zinc and calcium, respectively.

The procedure per se for growing a GGG single crystal from an oxide melt composed of gadolinium oxide and gallium oxide is well known in the art and mostly carried out, though not limited thereto, by the Czochralski method in which the oxide mixture in a crucible is melted and a seed crystal dipped in the melt at the tip thereof is gradually pulled up so that a single crystal grows from the melt on the seed crystal. The mixing ratio of the gadolinium oxide and gallium oxide should be approximately stoichiometric or 3:5 by moles for growing single crystals of GGG of the formula $Gd_3Ga_5O_{12}$.

It is important that the starting oxides of gadolinium and gallium each have a purity as high as possible in order to avoid any possible but unpredictable adverse influences caused by the impurities therein. For example, the oxides have desirably a nominal purity of at least 99.99% and the content of each of the impurities of calcium, magnesium, barium and strontium should be 10 p.p.m. or less.

The dopant element according to the invention, i.e. zinc, may be added to the oxide mixture in the form of oxide or carbonate thereof although it is also suitable to add the element in the form of the metal. This dopant element can be added to the oxide melt at any moment before seeding with a seed crystal on the oxide melt. That is, the dopant element may be added to the molten oxide mixture but the most convenient and reliable way is to admix the powdery oxides of gadolinium and gallium with the dopant element either as a metal or as a compound thereof from the standpoint to ensure uniformity in the distribution of the dopant element throughout the oxide melt. The powdery oxide mixture thus admixed with the dopant element is, if desired, shaped and sintered into blocks before introduction into a crucible of iridium or the like refractory metal in order to reduce the bulk volume of the charge to the crucible or to fully utilize the capacity of the crucible and then melted by heating, usually, with high frequency induction.

The amount of the dopant element to be added to the oxide melt or, rather conveniently, to the oxide mixture before melting should be such that the concentration thereof in the oxide melt is at least 1 p.p.m. by weight or, preferably, from 1 to 250 p.p.m. by weight or, more preferably, from 5 to 100 p.p.m. by weight based on the weight of the oxide mixture. It is therefore important to take into account the content of the same element initially contained in the undoped oxides of gadolinium and gallium. When the level of doping with the dopant element is lower than the above mentioned lower limit, no effect of doping naturally can be obtained while an excessive amount thereof over the above mentioned upper limit in the oxide melt is undesirable due to the contamination of the single crystal under growing with the dopant element adversely affecting the performance of the substrates for the magnetic bubble domain memory fabricated thereof.

The technique for growing a GGG single crystal from the oxide melt by the Czochralski method is conventional and need not be described here in detail. In short, the surface temperature of the oxide melt is kept slightly above the melting point of the GGG single crystal and a seed crystal of GGG is dipped in the melt at the tip thereof and gradually pulled up with simultaneous rotation around a vertical axis to have a single crystal growing on the seed crystal from the melt followed by rapid pulling of the thus grown single crystal apart from the remaining oxide melt to be allowed to cool.

As is understood from the above description, a great advantage is obtained by the method of the present invention comprising the addition of a specific dopant element to the oxide melt in a specified amount that a single crystal of GGG of high quality having remarkably decreased crystal defects and with no coloration can be grown from the oxide melt without the danger of crack formation regardless of the diameter of the single crystal boules.

For example, whereas about 20% or more in number of the single crystal boules grown according to the conventional method are unavoidably cracked when the boules have dimensions of a diameter of about 75 mm and a length of about 250 mm, substantially no boules are cracked according to the inventive method with the same boule dimensions as above. Therefore, a great improvement is achieved in the increased yield of satisfactory products or decrease of faulty or defective products. Furthermore, while it is always necessary in the prior art to very slowly cool the grown single crystal after completion of pulling-up in the Czochralski method in order to minimize crack formation in the single crystal boules, the rate of cooling can be remarkably increased according to the inventive method so that the overall time consumption for the preparation of a single crystal boule is greatly reduced contributing to the improvement of the productivity.

Moreover, the addition of zinc as the dopant element in the oxide melt has another effect of remarkably decreasing the absorption of light through the single crystal, in particular, in the wavelength region between 300 and 400 nm responsible to the yellowish tint of the single crystals.

Following are the Examples and Comparative Examples to illustrate the inventive method in further detail.

COMPARATIVE EXAMPLE 1

An oxide mixture was prepared by taking gadolinium oxide of 99.99% purity and gallium oxide of 99.99% purity in the stoichiometric proportion of 3:5 by moles and 13,000 g of the oxide mixture were introduced into an iridium crucible of 150 mm outer diameter and 150 mm height and melted therein by heating with high frequency induction. The contents of magnesium, calcium, barium and strontium as impurities in each of the oxides were each 5 p.p.m. by weight or less as determined by the atomic absorption spectrometry or emission spectrography.

A seed crystal of GGG in the form of a rod of 5 mm×5 mm square cross section having a crystal orientation of <111> was dipped in the oxide melt and a GGG single crystal was grown by gradually pulling up the seed crystal in a conventional manner. The cross sectional configuration of the thus grown GGG single crystal was unsymmetrical or irregular already at the shoulder portion of the boule and no straight boule could be obtained.

COMPARATIVE EXAMPLE 2

The same mixture of the gadolinium and gallium oxides as in Comparative Example 1 above was further admixed with calcium carbonate in an amount of 1.625 g per 13,000 g of the oxide mixture and the crystal growing was carried out in the same manner as in Comparative Example 1 to give a single crystal boule of about 85 mm diameter and about 250 mm length. It was found that cracks had been formed throughout the boule taken out of the apparatus after cooling.

The thus prepared single crystal of GGG was relatively free of crystal defects but was tinted in light yellow in the whole body of the boule.

EXAMPLE 1

The same mixture of the gadolinium and gallium oxides as in Comparative Example 1 above was further admixed with 0.566 g of zinc oxide per 13,000 g of the oxide mixture corresponding to an amount of elementary zinc of about 35 p.p.m. by weight in the thus doped oxide mixture and growing of a GGG single crystal was carried out in the same manner as in Comparative Example 1 by use of an iridium crucible of the same dimensions and a seed crystal of also the same dimensions and the same crystal orientation to give a single crystal boule of about 85 mm diameter and about 250 mm length. The single crystal boule taken out of the apparatus after cooling had good appearance visually without yellowish tint or formation of cracks. Crystallographic inspection of this single crystal indicated very few crystal defects with a lattice constant of 12.3822 Å.

EXAMPLE 2

The experimental procedure was substantially the same as in Example 1 except that the amount of zinc oxide added to the oxide mixture was increased to 1.618 g corresponding to a zinc content of about 100 p.p.m. by weight in the oxide mixture. The quality of the single crystal boule as grown was equally satisfactory as in Example 1.

EXAMPLE 3

A number of runs of single crystal growing were undertaken in substantially the same manner as in Example 1 above by use of either one of several different dopant elements including calcium, aluminum, scandium, yttrium, lanthanum, lutetium, antimony and zinc in which the concentration of each dopant element was 50 p.p.m. by weight based on the oxide mixture of gadolinium and gallium and the effect of zinc doping on the crack formation in the single crystals as grown was examined statistically in relation to the cooling rate after crystal growth. Thus, the cooling rate of the single crystal after completion of the pulling-up was varied by controlling the high frequency power input so that the time taken for cooling down was 24 hours, 20 hours or 13 hours. The diameter of the GGG single crystals was 85 mm or 108 mm.

When zinc was added as the dopant element, no crack formation occurred in 25 runs of crystal growing irrespective of the cooling rate and the diameter of the single crystal boule. On the other hand, doping with calcium was less effective in preventing crack formation. For example, no crack formation occurred in 20 runs with calcium doping when the time for cooling was 24 hours with the crystal diameter of 85 mm while the single crystal boules obtained in one of the 8 runs and four of the 20 runs were found cracked when the cooling time was shortened to 20 hours and 13 hours, respectively, with the same crystal diameter. When the diameter of the single crystal boule was 108 mm, two of the three boules obtained in 3 runs were found cracked with the cooling time of 13 hours. The doping with the other dopant elements was somewhat more effective than calcium and crack formation was prevented when the cooling time was 24 hours or 20 hours with the crystal diameter of 85 mm but one of the 12 boules obtained in 12 runs was found cracked when the cooling time was decreased to 13 hours with the same crystal diameter.

EXAMPLE 4

The single crystals of GGG prepared in the preceding example by doping with zinc and calcium were sliced into plates and the absorption of light in these single crystals was examined spectrophotometrically in the wavelength region of near ultraviolet to visible.

Figure 2:
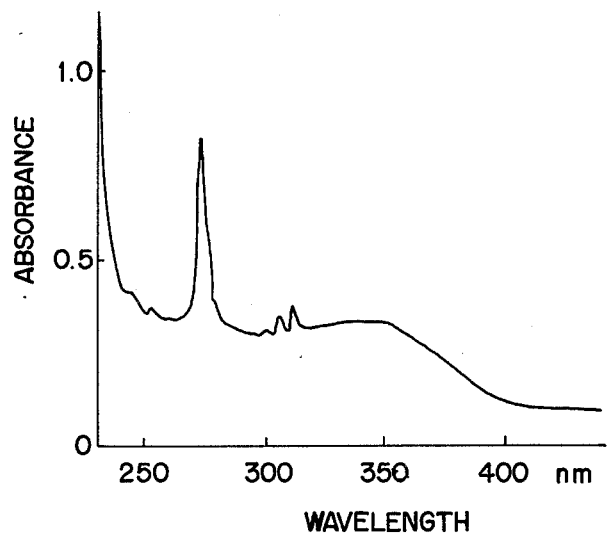

FIGS. 1 and 2 are each the absorption spectrum of the zinc- and calcium-doped GGG single crystals, respectively, as taken on a recording spectrophotometer. As is clear from the comparison of these spectra, the calcium-doped crystal had a plateau-like absorption at around 300 nm which is responsible to the yellowish tint of the crystal while the absorption in this region was much smaller in the zinc-doped single crystal.

What is claimed is:

1. A method for the preparation of a single crystal boule of gadolinium gallium garnet by the Czochralski method which comprises admixing a melt of gadolinium oxide and gallium oxide in a molar proportion of approximately 3:5 with zinc as a dopant element in an amount corresponding to a concentration thereof in the melt of the oxides in an amount of at least 1 p.p.m. by weight based on the weight of the oxide melt and growing a single crystal of gadolinium gallium garnet from the oxide melt.

2. The method as claimed in claim 1 wherein the concentration of the dopant element in the oxide melt is in the range from 5 p.p.m. to 100 p.p.m. by weight based on the weight of the oxide melt.

* * * * *